(12) United States Patent
Belyansky et al.

(10) Patent No.: US 7,585,704 B2
(45) Date of Patent: Sep. 8, 2009

(54) METHOD OF PRODUCING HIGHLY STRAINED PECVD SILICON NITRIDE THIN FILMS AT LOW TEMPERATURE

(75) Inventors: Michael P. Belyansky, Bethel, CT (US); Oleg Gluschenkov, Poughkeepsie, NY (US); Ying Li, Newburgh, NY (US); Anupama Mallikarjunan, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/907,454

(22) Filed: Apr. 1, 2005

(65) Prior Publication Data

US 2006/0223290 A1 Oct. 5, 2006

(51) Int. Cl.
*H01L 21/82* (2006.01)
(52) U.S. Cl. .................. 438/131; 438/792; 438/798
(58) Field of Classification Search ............... 438/50, 438/485, 513, 680, 791, 792, 798, FOR. 395, 438/FOR. 401, 131
See application file for complete search history.

(56) References Cited

U.S. PATENT DOCUMENTS

| | | | | |
|---|---|---|---|---|
| 4,742,020 | A | * | 5/1988 | Roy ........................ 438/149 |
| 4,794,064 | A | * | 12/1988 | Yamazaki et al. .......... 430/57.7 |
| 4,859,554 | A | * | 8/1989 | Yamazaki et al. .......... 430/57.7 |
| 5,153,701 | A | * | 10/1992 | Roy ........................ 257/635 |
| 5,720,642 | A | * | 2/1998 | Hattori ........................ 445/50 |
| 5,756,404 | A | * | 5/1998 | Friedenreich et al. ....... 438/791 |
| 5,976,637 | A | * | 11/1999 | Gottscho et al. ............ 427/573 |
| 5,981,403 | A | | 11/1999 | Ma et al. |
| 6,134,971 | A | * | 10/2000 | Misra et al. ................... 73/777 |
| 7,022,561 | B2 | * | 4/2006 | Huang et al. ............... 438/197 |
| 7,105,394 | B2 | * | 9/2006 | Hachimine et al. ......... 438/197 |
| 7,125,758 | B2 | * | 10/2006 | Choi et al. .................. 438/151 |
| 7,262,472 | B2 | * | 8/2007 | Pidin ........................ 257/410 |
| 2003/0040158 | A1 | * | 2/2003 | Saitoh ........................ 438/279 |
| 2004/0071890 | A1 | * | 4/2004 | Hashizume et al. ......... 427/408 |
| 2004/0075148 | A1 | * | 4/2004 | Kumagai et al. ........... 257/369 |
| 2005/0253173 | A1 | * | 11/2005 | Wang et al. ................ 257/282 |
| 2005/0269650 | A1 | * | 12/2005 | Pidin ........................ 257/411 |

(Continued)

OTHER PUBLICATIONS

Growth Study of Wide Bandgap a-Si:H and a-SiN:H by PECVD Method for application in thin film transistor, Jasruddi et al., ICSE 2000 Proceedings, Nov. 2000.*

*Primary Examiner*—N Drew Richards
*Assistant Examiner*—Ankush K Singal
(74) *Attorney, Agent, or Firm*—Scully, Scott, Murphy & Presser, P.C.; H. Daniel Schnurmann (57) ABSTRACT

A method for increasing the level of stress for amorphous thin film stressors by means of modifying the internal structure of such stressors is provided. The method includes first forming a first portion of an amorphous film stressor material on at least a surface of a substrate, said first portion having a first state of mechanical strain defining a first stress value. After the forming step, the first portion of the amorphous film stressor material is densified such that the first state of mechanical strain is not substantially altered, while increasing the first stress value. In some embodiments, the steps of forming and densifying are repeated any number of times to obtain a preselected and desired thickness for the stressor.

23 Claims, 4 Drawing Sheets

U.S. PATENT DOCUMENTS

2006/0157795 A1* 7/2006 Chen et al. .................. 257/369
2007/0023843 A1* 2/2007 Shimizu et al. ............. 257/369
2007/0102768 A1* 5/2007 Shimizu et al. ............. 257/369
2007/0258034 A1* 11/2007 Lee et al. .................... 349/155

* cited by examiner

METHOD OF PRODUCING HIGHLY STRAINED PECVD SILICON NITRIDE THIN FILMS AT LOW TEMPERATURE

FIELD OF THE INVENTION

The present invention relates to semiconductor device manufacturing, and more particularly to a method for increasing the level of stress of an amorphous thin film stressor, i.e., stress inducing, material.

BACKGROUND OF THE INVENTION

Stress engineering plays an important role in increasing the performance of semiconductor devices. Typical examples of such application of stress are widely used strained semiconductor lasers and strained transistors (e.g., strained-channel field effect transistors, FETs) and related strained circuits such as complementary metal oxide semiconductor (CMOS) circuits. In the case of strained FET channels, the stress is applied to the transistor structure in such a way that the device channel region is beneficially strained causing increased mobility of electrons (or holes), which in turn gives a substantial improvement in device speed. The positive effect of crystal lattice strain onto electron and hole mobility depends on the crystal symmetry of a particular semiconductor and how various components of the strain tensor in the transistor channel are related to the semiconductor lattice symmetry or, more specifically, how they are related to the symmetric planes, axes, and centers of symmetry of the lattice.

Accordingly, the type of beneficial channel strain is a strong function of (a) semiconductor type; (b) carrier type (electron or hole); (c) crystal orientation and rotation of the channel plane; and (d) direction of electrical current in the channel. Further, the beneficial channel strain can be induced by many different techniques because it depends on the transistor's geometrical structure and how the external stress is applied.

In one useful example, the stress is applied to both silicon-based nFETs and pFETs formed on standard (100) silicon wafers via a highly stressed film that covers the transistor gates and partly covers the source/drain regions. This type of highly stressed film is referred to in the art as a stressed gate liner. In such an application, a tensile stress gate liner is applied to the nFET device to improve electron mobility, while a compressive stress gate liner has been shown to speed up pFET devices. This situation is shown in FIG. 1.

Figure 1:
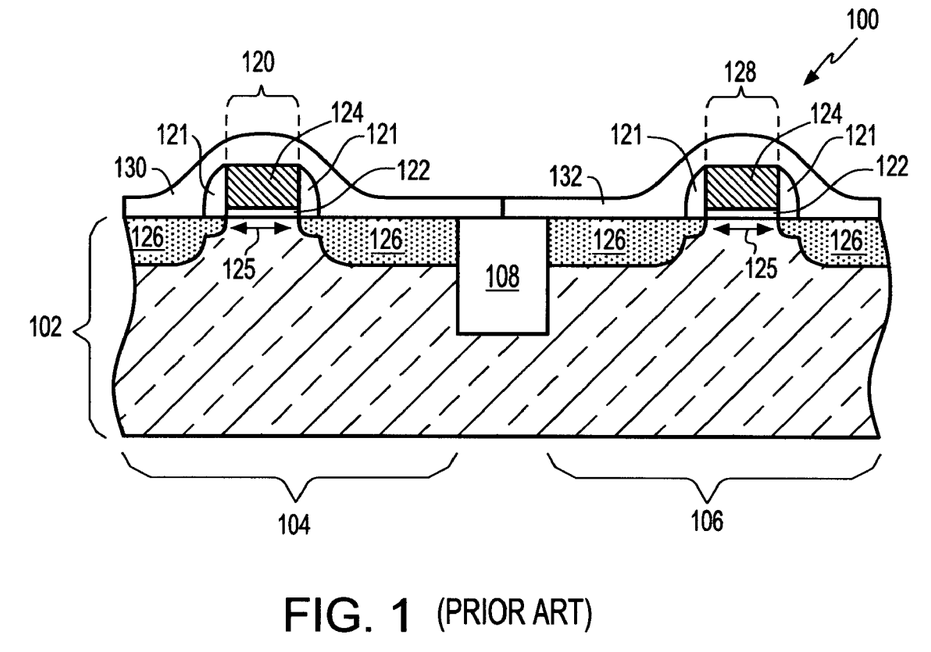
FIG. 1 is a pictorial representation (through a cross sectional view) illustrating a prior art semiconductor structure wherein stress is created in the channel regions of CMOS transistors by applying a highly stressed SiN liner on top of the transistors.

Specifically, FIG. 1 shows (through a cross sectional view) a semiconductor structure 100 that comprises a semiconductor substrate 102 that includes an nFET device region 104 and a pFET device region 106 that are separated by an isolation region 108. Atop the nFET device region 104 is an nFET 120 that includes a gate dielectric 122 and a gate conductor 124 that is doped with an n-type dopant. The nFET 120 includes source/drain diffusion regions 126 that are located in the semiconductor substrate 102 and a spacer 121 that is located on exposed sidewalls of at least the gate conductor 124. The pFET device region 106 includes a pFET 128 that includes a gate dielectric 122 and a gate conductor 124 that is doped with a p-type dopant. Source/drain diffusion regions 126 for the pFET 128 are present in the semiconductor substrate 102 at the footprint of the pFET 128 and a spacer 121 is also present on exposed sidewalls of at least the gate conductor 124. As shown, a tensile nitride liner 130 is present in the nFET device region 104, while a compressive nitride liner 132 is present in the pFET device region 106.

In this prior art example, the stressed liner (represented by liner 130 and 132) is a stressor material which exerts a force on the transistor structure. Both the shape of the stressor (in this example, the liner which is self-aligned to the transistor channel), the type of its stress (tensile or compressive), and transistor structure yield a beneficial strain in the respective transistor channels 125. Once the crystal type and geometries of the transistor and stressor are fixed, a high level of stress in the stressor leads to a higher strain in the channel 125 resulting in a higher performance improvement. Accordingly, it is highly desirable to increase stress levels in a stressor material.

Other types of stressor materials are also known in the prior art. For example, a SiGe crystal island embedded into a silicon crystal can cause a highly compressive stress in surrounding Si. This crystalline stressor can be employed to improve performance of a Si-based pFET. In another example, an amorphous silicon nitride stressor is shaped in the form of a gate spacer.

Combinations of various types and shapes of stressors are also known to further improve device performance. For instance, the aforementioned embedded SiGe crystalline stressor can be combined with the aforementioned amorphous stressed gate liner to further improve performance of a Si-based pFET.

Despite the advances made in the prior art for forming amorphous stressed gate liners, there is a need for providing improved amorphous stressor materials wherein the stress level for both cases of tensile and compressive strain are increased. Such a material would be employed to increase the beneficial level of strain in the adjacent semiconductor structure, irrespective of the particular stressor shape, type of semiconductor crystal, type of semiconductor device, and geometry of the device.

Further, it highly desirable that the improved stressor material is formed at a low temperature (on the order of about 400-550° C. or below) so as to preserve temperature-sensitive elements of the adjacent microstructure. For example, certain III-V compound semiconductors such as, for example, GaAs, are not stable above 500° C. In addition, certain elements of silicon-based transistors (e.g., the silicide contacts and the highly-activated dopants) can be undesirably affected by high-temperature processes.

Plasma-enhanced chemical vapor deposition (PECVD) processes are conducted at below about 500° C. One well-known example of an amorphous stressor material is an amorphous silicon nitride film deposited by a PECVD process. Typically, the stress in silicon nitride films formed by PECVD is modulated by optimizing gas flows, plasma powers and other deposition parameters. Such optimization only provides modest gains in stress level, while it is very effective in adjusting the stress sign (compressive or tensile).

It is also possible to achieve relatively high stress level in SiN thin films by increasing the PECVD deposition temperature (above 500° C.) or by using a high temperature rapid thermal chemical vapor deposition (RT CVD) technique at a temperature of about 600° C. or above. While RT CVD can produce highly strained tensile SiN films, the typical temperature of the RT CVD process is close to 700° C.

Also, compressive RT CVD films are not known to exist. State of the art CMOS devices have relatively low middle-of-the-line (MOL) temperature budget, which is gradually approaching the back-end-of-the-line (BEOL) temperatures of about 400° C. The MOL temperature budget issue is becoming especially acute for devices based on high-temperature-unstable NiSi since defect levels in these devices increase dramatically with a temperature greater than 450° C. Therefore all high temperature MOL solutions cannot be used and achieving a high stress level by a PECVD technique at low temperature (less than 450° C.) is becoming a critical component of 65 and 45 nm node device engineering.

SUMMARY OF THE INVENTION

The present invention provides a method for increasing the level of stress for amorphous thin film stressors by means of modifying the internal structure of such stressors. The inventive method comprises:

forming a first portion of an amorphous film stressor material on at least a surface of a substrate, said first portion having a first state of mechanical strain defining a first stress value; and densifying the first portion of the amorphous film stressor material such that the first state of mechanical strain is not substantially altered, while increasing the first stress value.

In the inventive method, the term "substrate" is meant to include a semiconductor substrate and/or a FET.

In some embodiments, the steps of forming and densifying are repeated any number of times to obtain a preselected and desired thickness for the amorphous thin film stressor material.

The stressor film formed by the inventive method described above may be optionally treated after surface densification by one of the known methods that alter (increase) its mechanical strain and therefore further increase its stress. The stressor can also be optionally shaped by lithography and etching into any form to maximize its effect (exertion of force) onto useful microstructures.

In one embodiment of the present invention, the amorphous stressor is a hydrogen-containing amorphous silicon nitride (SiN) film that is formed by a conventional deposition process. After deposition, the hydrogen-containing amorphous SiN film is subjected to a densification process that is performed using a low temperature plasma treatment which densifies an upper region of the SiN film by introducing active nitrogen (such as, for example, atomic nitrogen, molecular nitrogen, or atomic nitrogen ions) into the upper region of the SiN film. In this embodiment, the plasma treatment is performed at a temperature of about 550° C. or less.

The method of the present invention can be used in combination with other known methods of increasing internal stress of stressors as well as in various geometrical schemes of intelligently applying such stressors for improving electrical and optical parameters of useful microdevices. The inventive method further works at a low process temperature of about 550° C. or below which makes the inventive method particularly useful for temperature-sensitive microstructures.

Other known post-treatments employed for increasing the stress level of thin films are directed to changing the state of mechanical strain inside the treated film by substantially rearranging its chemical bonding. Accordingly, such methods work for increasing only one type of stress (tensile or compressive). For instance, the intense heating of the stressed silicon nitride film results in detaching and removing hydrogen atoms from Si—H and N—H bonds present in such a film, which leads to an increased level of tensile stress but, a decreased level of compressive stress. The present invention is teaching away from such art because it works equally well for both tensile and compressive films.

The inventive method is a departure from the prior art because it is directed towards preserving the mechanical strain state of the deposited film, while increasing its stress. It therefore allows the independent optimization of the sign and level of mechanical strain in the as-deposited film as well as the final stress level in the resultant film.

DETAILED DESCRIPTION OF THE INVENTION

The present invention, which provides a method of increasing the level of stress for an amorphous thin film stressor material by a technique in which the internal structure of the film is modified, will now be described in greater detail by referring to the following discussion and drawings that accompany the present application. It is noted that the drawings of the present application are provided for illustrative purposes and thus they are not drawn to scale.

Figure 2A:
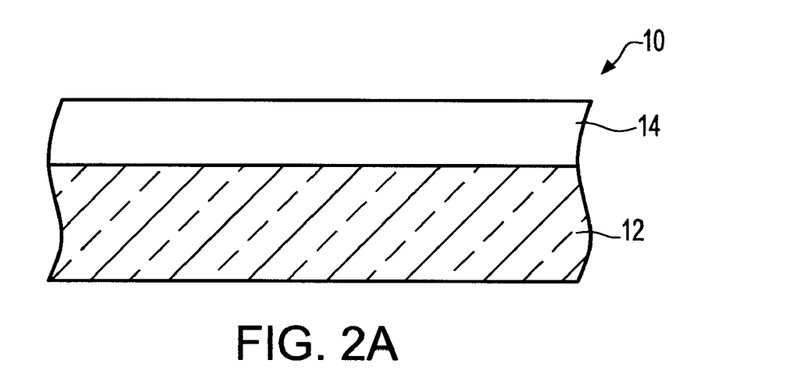
FIGS. 2A-2C are pictorial representations (through cross sectional views) illustrating the various processing steps of the present invention for increasing the stress value of a stressor material that is formed on a surface of a semiconductor substrate.
Figure 2B:
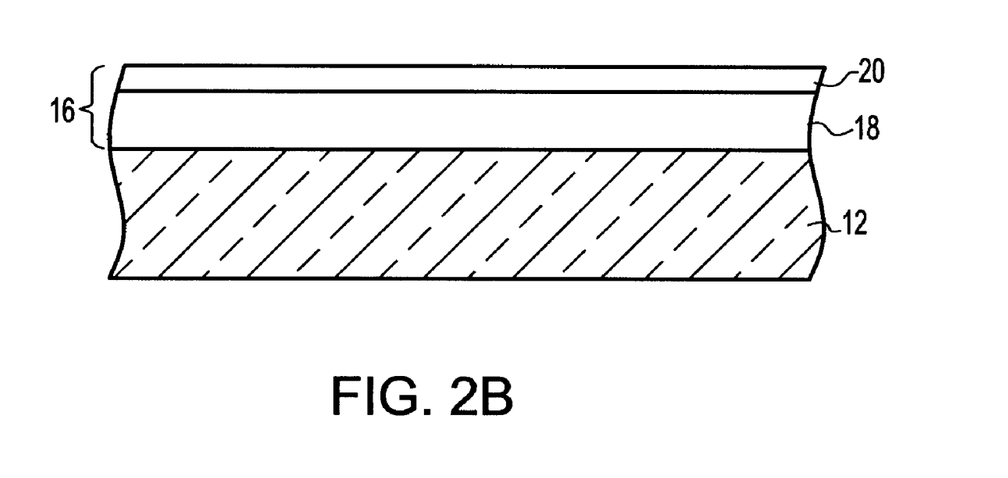
Figure 2C:
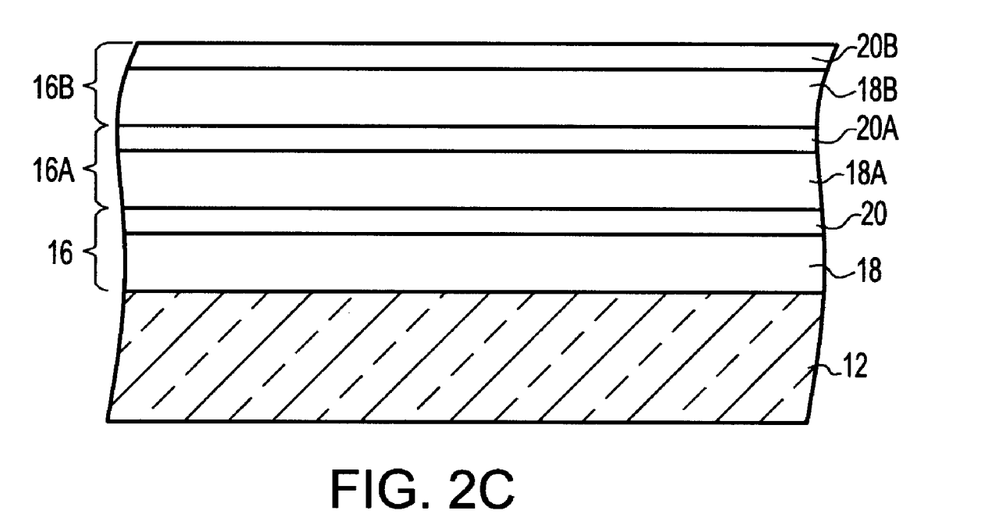
Figure 3:
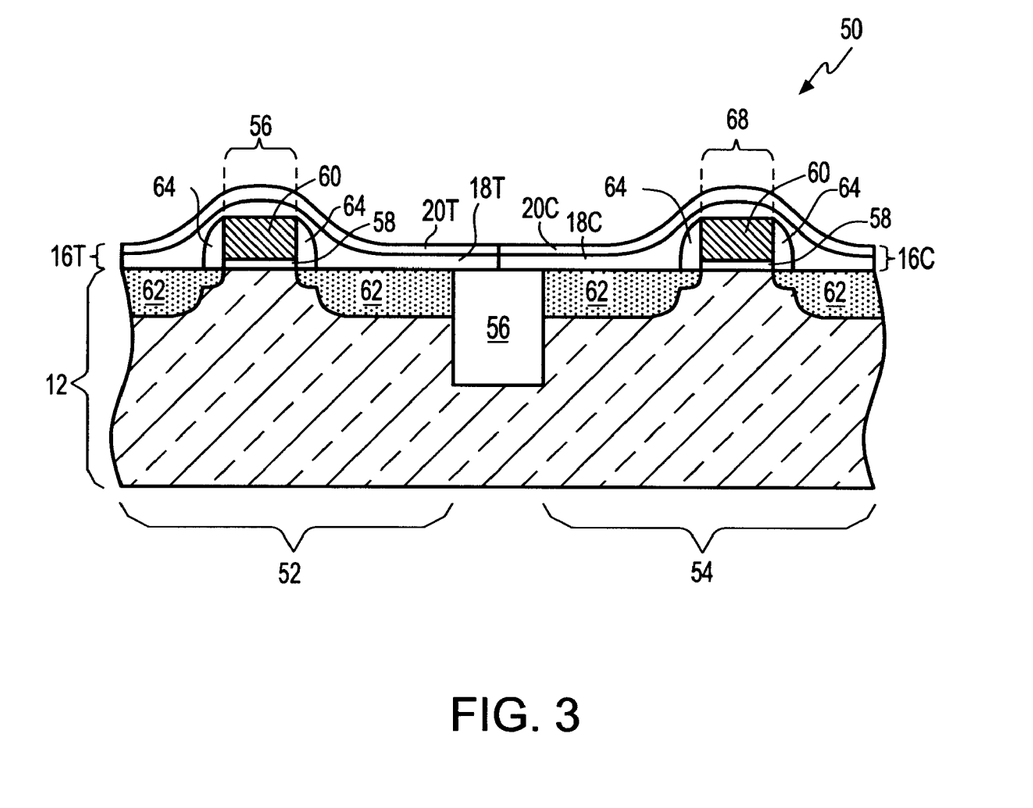
FIG. 3 is a pictorial representation (through a cross sectional view) illustrating a semiconductor structure wherein stress is created in the channel regions of CMOS transistors by applying a highly stressed stressor material of the present invention on top of portions of the semiconductor substrate as well as transistor devices that are formed atop the substrate.

Reference is made to FIGS. 2A-2C which illustrates the basic processing steps of the present invention. Specifically, FIG. 2A illustrates a structure 10 that includes an amorphous thin film stressor material 14 that is formed atop a surface of a semiconductor substrate 12. It is observed that FIGS. 2A-2C illustrate only a small portion of the semiconductor substrate 12 and that the inventive method can be used over the entire surface of the semiconductor substrate 12 which can include transistor devices, such as shown in FIG. 3, thereon. The structure illustrated in FIG. 3 will be discussed in greater detail herein below. Although the following discussion describes the situation when the stressor material is deposited on a semiconductor substrate, the present invention works equally well when the stressor material is formed on a FET or on both a FET and a semiconductor substrate.

Referring back to FIG. 2A, that structure was made by first providing a semiconductor substrate 12. The semiconductor substrate 12 may be a preprocessed substrate that has one or more transistors located on a surface thereof. For clarity, the transistors are not shown in the sectional views of FIGS. 2A-2C. The semiconductor substrate 12 employed in the present invention comprises any semiconductor material including, for example, Si, SiGe, SiGeC, SiC, GaAs, InAs, InP and other III/V and II/VI compound semiconductors. The semiconductor substrate 12 may also comprise a layered semiconductor substrate such as, for example, Si/SiGe, a silicon-on-insulator (SOI) or a SiGe-on-insulator substrate. The semiconductor substrate 12 may be doped, undoped or contain one or more doped regions therein. For example, the semiconductor substrate 12 may include well regions, source/drain diffusion regions, source/drain extension regions, halo regions and the like. The semiconductor substrate 12 may also include an isolation region which isolates various types of semiconductor devices from each other. The semiconductor substrate 12 may have any major or minor crystallographic orientation including, for example, (110), (100), or (111). The semiconductor substrate 12 may be unstrained, strained or have a combination of strained and unstrained regions.

The semiconductor substrate 12 may be a hybrid semiconductor substrate that includes at least two planar regions of the same or different semiconductor material, each region having different crystal orientations as fabricated, for example, in co-assigned and co-pending U.S. application Ser. No. 10/250, 241, filed Jun. 17, 2003, entitled "High-Performance CMOS SOI Devices on Hybrid Crystal Oriented Substrates".

After providing the semiconductor substrate 12, an amorphous thin film stressor material 14 is formed on at least a surface of the semiconductor substrate 12. In accordance with the present invention, the inventive amorphous thin film stressor material 14 has a first state of mechanical strain (either compressive or tensile) defining a first stress value. The first stress value may vary depending on the material being deposited, the substrate in which the material is formed on as well as the technique that was used to deposit that film. A typical first stress value for an as PECVD deposited amorphous hydrogen-containing SiN film that is under tensile strain is about 0.5-1.0 GPa, while a typical first stress value of the same film under compressive strain is about −1-1.5 GPa.

The amorphous thin film stressor material 14 (which can be referred to as an as deposited film) is formed utilizing a conventional deposition process including, for example, chemical vapor deposition, plasma-enhanced chemical vapor deposition or rapid thermal chemical vapor deposition. Typically, the deposition process is performed at a temperature of about 550° C. or less so as not to adversely affect any temperature-sensitive element that is located within, or on, the semiconductor substrate 12. Preferably, the amorphous thin film stressor material 14 is formed by a plasma-enhanced chemical vapor deposition process.

The as deposited amorphous thin film stressor material 14 formed at this point of the present invention typically has a thickness from about 1 to 200 nm, with a thickness from about 20 to about 100 nm being even more typical.

The amorphous thin film stressor material 14 comprises any stress inducing material including, for example, nitrides, oxides or metals. Preferably, the amorphous stressor material 14 is composed of SiN. The stress inducing material may include hydrogen and thus hydrogen-containing materials such as hydrogen-containing SiN are completed herein. The term "amorphous" is used herein to denote that the stressor material 14 lacks a well-defined crystal structure.

It is noted that the as deposited amorphous thin film stressor material 14 shown in FIG. 2A is no different from prior art stressor materials at this point of the present invention. FIG. 2B shows the structure that is formed after subjecting the structure including the as deposited stressor material 14 to a densification step. In accordance with the present invention, the densification step is performed under conditions such that the first state of mechanical strain of the stressor material is not substantially altered, while increasing the first stress value. That is, the densification step of the present invention increases the stress value of the stressor material 14 to a value that is greater than that of the first stress value, while not changing whether the layer is under compressive or tensile strain. By way of an example, the densification step of the present invention increases the stress value of the tensile strained hydrogen-containing SiN material from an as deposited value of about 0.8 GPa to a second stress value of about 1.2 GPa, while the stress value of the compressively strained material is also increased from an as deposited value of about 1.4 GPa to a second stress value of about 2.0 GPa.

As shown in FIG. 2B, the densification step results in an amorphous thin film stressor material 16 that has an upper region 20 and a lower region 18. The upper region 20 has a density that is greater than that of the lower region 18; the density of the lower region 18 is typically the density of the as deposited film 14. The density within the upper and lower regions may vary depending on a number of factors including, for example, the type of stressor material and the thickness thereof as well as the conditions of the densification step. Typically, and for the stressor material exemplified above, the lower region 18 of the hydrogen-containing SiN stressor film has a density of about 2.4 gm/cc, while the upper region 20 of that same film has a density of about 2.6 gm/cc.

The thickness of the upper region 20 of the amorphous thin film stressor material 16 formed by the densification step of the present invention may vary depending on the type of densification process used as well as the conditions that were used during densification. Typically, the thickness of the upper region 20 that is formed by densification is from about 0.5 to about 50 nm, with a thickness from about 1 to about 10 nm being even more typical.

Densification of the as deposited amorphous thin film stressor material 14 may be performed utilizing any technique that is capable of increasing the density of a surface portion of that layer. Densification processes that can be used to increase the stress value of the as deposited thin film stress material 14 include, but are not limited to: plasma nitridation that is performed at a temperature of about 550° C. or less or radiation exposure. Preferably, densification is achieved in the present invention by utilizing a plasma nitridation process.

When plasma nitridation is employed to densify an upper portion of the as deposited amorphous thin film stressor material 14, any nitrogen-containing plasma that comprises atomic nitrogen, molecular nitrogen, atomic nitrogen ions or combinations thereof can be employed. The nitrogen-containing plasma is derived from any nitrogen-containing source such as, for example, $N_2$, NO, $NH_3$, $N_2O$ or mixtures thereof. As indicated above, the plasma nitridation process employed in the present invention is carried out at a temperature of about 550° C. or less, with a temperature from about 350° to about 450° C. being more typical. The plasma nitridation process is typically performed for a time period from about 0.5 to about 200 seconds, with a time period from about 5 to about 60 seconds being even more typical. It is noted that no further improvement in stress level can be obtained by extending the time range beyond that mentioned herein.

At this point of the present invention, the densified amorphous thin film stressor material 16 having an increased stress value as compared to an as deposited film can be shaped into any form, such as, for example, a spacer or liner, to maximize its effects (i.e., exertion of force) onto a useful microstructure. Shaping can be achieved by lithography and etching.

In some embodiments and as shown in FIG. 2C, the steps of depositing and densification can be repeated any number of times to provide a multilayered amorphous thin film stressor material that has alternating layers of non-densified and densified regions. Moreover, the steps of the present invention may be repeated any number of times to provide a stressor material having an increased value of stress having a preselected thickness. In FIG. 2C, the structure includes three layers of densified thin film stressor materials (16, 16A and 16B) each including a lower non-densified region (18, 18A and 18B) and an upper densified region (20, 20A and 20B).

The multilayered amorphous thin film stressor material shown in FIG. 2C can be shaped into any form, such as, for example, a spacer or liner, to maximize its effects (i.e., exertion of force) onto a useful microstructure. Also, the multi-layered densified amorphous thin film stress material can be optionally treated with any conventional method that can further increase the stress value of the material.

It should be noted that the various steps of the present invention could be performed in-situ without breaking vacuum between deposition and densification steps, or the vacuum can be broken between the steps of deposition and densification or between multiple deposition and densification steps.

As indicated above, the method of the present invention can be used to increase the stress value of stress liner materials that are formed atop of a semiconductor substrate that includes transistors formed thereon. Such a structure is shown, for example, in FIG. 3. Note that FIG. 3 is similar to FIG. 1 except for the presence of the inventive densified amorphous thin film stressor material 16 that includes a lower, non-densified region 18 and an upper densified region 20.

Specifically, FIG. 3 shows (through a cross sectional view) a semiconductor structure 50 that comprises a semiconductor substrate 12 that includes an nFET device region 52 and a pFET device region 54 that are separated by an isolation region 56. Atop the nFET device region 52 is an nFET 56 that includes a gate dielectric 58 and a gate conductor 60 that is doped with an n-type dopant. The nFET 56 also includes source/drain diffusion regions 62 that are located in the semiconductor substrate 12 and a spacer 64 that is located on exposed sidewalls of at least the gate conductor 60. The pFET device region 54 includes a pFET 68 that includes a gate dielectric 58 and a gate conductor 60 that is doped with a p-type dopant. Source/drain diffusion region 62 for the pFET 68 are present in the semiconductor substrate 12 at the footprint of the pFET 68 and a spacer 64 is also present on exposed sidewalls of at least the gate conductor 60. As shown, a tensile nitride liner 16T comprising regions 18T and 20T is present in the nFET device region 52, while a compressive nitride liner 16C comprising regions 18C and 20C is present in the pFET device region 54.

The structure shown in FIG. 3, minus the inventive stressor material having an upper region that has a higher density than a lower region, is formed utilizing conventional processes well known in the art. For example, the isolation region 56 can be formed by first defining a trench into the substrate via lithography and etching. Following the etching step, an optional trench dielectric liner can be formed, and thereafter a trench dielectric such as an oxide can be deposited into the trench. A planarization process such as chemical mechanical polishing (CMP) or grinding can follow the trench fill.

Alternatively, a location oxidation of silicon process can be used to form the isolation region.

Next, FETs are formed on the surface of the semiconductor substrate 12 into the nFET device region 52 and the pFET device region 54 utilizing any conventional CMOS process. One method includes the steps of forming a layered stack comprising a gate dielectric and a gate conductor onto the surface of the semiconductor substrate 12. The gate dielectric can be formed by a thermal process such as oxidation or by a conventional deposition process. The gate dielectric that can be employed in the present invention comprises an oxide, nitride, oxynitride or multilayers thereof. The gate conductor is formed by a conventional deposition process. When polySi or SiGe gates are used, the conductive material can be formed by an in-situ doping deposition process or by deposition followed by ion implantation. Implantation masks and different ion implantations can be used to form FETs of different conductivities. Following the formation of the layered stack, at least the gate conductor (and optional the gate dielectric) is patterned by lithography and etching. A thermal process can be used to form a passivation layer about each patterned gate region. Thereafter, source/drain extensions are formed by ion implantation and annealing. Next, sidewalls spacers are formed by deposition and etching and thereafter the source/drain diffusion regions are formed by ion implantation and annealing. The annealing step used for activating the S/D extensions mentioned above can be omitted and activation can occur during the activation of the source/drain regions. In some embodiments, the sidewall spacers may include the inventive densified amorphous stressor material alone or with another insulating material.

In addition to this technique, a conventional gate replacement process can be used to form FETs on the surface of the semiconductor substrate.

The stressor material of the present invention is then formed by utilizing the steps described above. Specifically, the stressor material on each FET can be processed using the steps of the present invention in a single process. Alternatively, the stressor material on each FET is processed in multiple steps in which a block mask is formed over one device region during the formation of the stressor material in the unprotected region and then that block mask is removed and the process is repeated by forming a block mask on the previously unprotected region containing the stressor material of the present invention. After densification, an etching step can be used to shape the stressor material into any desirable shape.

Figure 4A:
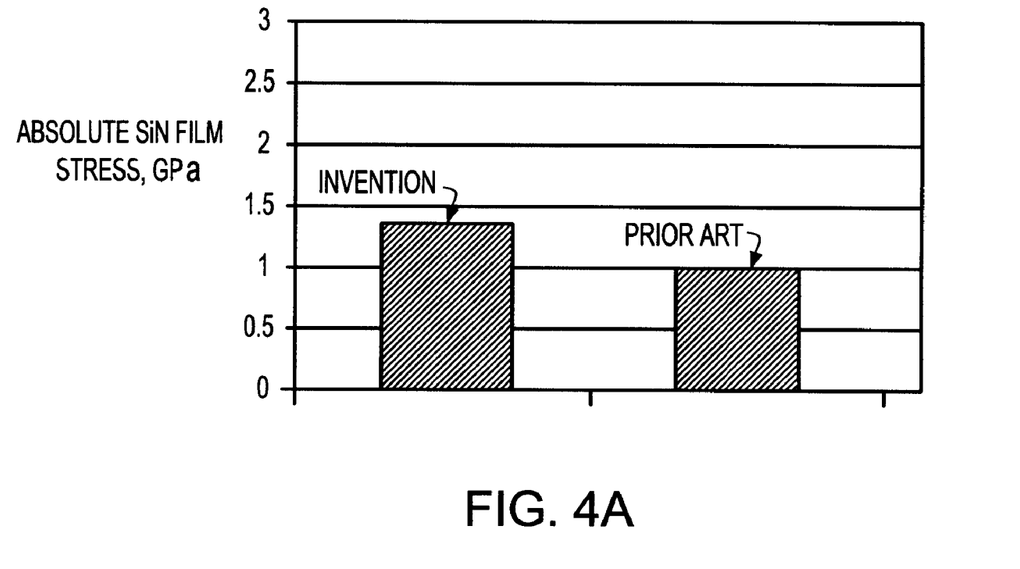
FIGS. 4A-4B are graphs showing a SiN stressor material of the present invention as compared with a prior art SiN stressor material which was formed by multilayer interrupted deposition both under tensile strain (FIG. 4A) and under compressive strain (FIG. 4B).
Figure 4B:
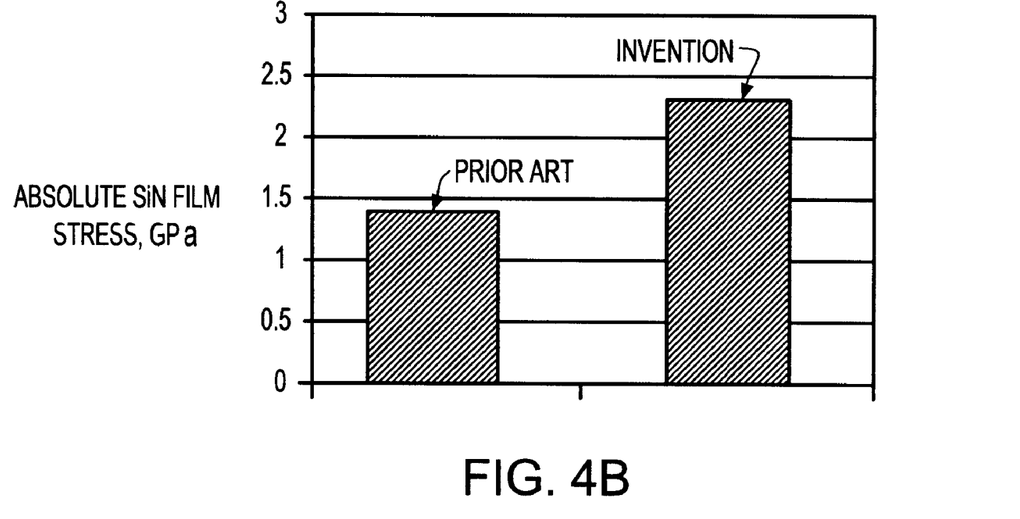

FIGS. 4A and 4B are graphs comparing an inventive multilayered densified amorphous SiN stressor material under tensile strain (FIG. 4A) and compressive strain (FIG. 4B) to a multilayered interrupted deposited prior art thin film SiN stressor material. The inventive material is labeled as Inventive, while the prior art material is labeled as Prior Art. Note that the prior art method of forming a SiN film by interrupted deposition of various SiN layers provides a known means to increase the stress value of a stressor material. The data shown in these figures indicate that the inventive method provides a means to further increase the stress value of SiN beyond that which can be achieved using this prior art technique.

Specifically, a 70% increase in stress can be achieved using the inventive process compared to a similar multilayer film that was not subjected to densification between each deposition step. An increase is shown for both tensile and compressive SiN films.

A sixteen-layered stressed SiN film was prepared using the method of the present invention in which PECVD was employed. Each SiN layer of this multilayered structure had a thickness between 10-10,000 Å and between each deposition the SiN film was subjected to densification using active nitrogen treatment, i.e., plasma nitridation. The X-ray reflectively (XRR) data of that film showed that each individual layer consists of two regions (a lower region and an upper region that has a higher density than the lower region). Table 1 below summarizes the density of the upper region. Apparently, the active nitrogen treatments resulted in a substantially dense top film. The thickness of the upper region is estimated to be between 15-25 Å. The optimum duration of the treatment is from 10 to 60 seconds. An increase in treatment beyond this time range did not yield any substantial increase in the density of the upper region, nor did it increase the thickness or the stress value of the film.

TABLE 1

XRR DATA

| Sample | Density of upper region of the SiN film after densification (gm/cc) | Density of upper region of the SiN film with no densification (gm/cc) |
|---|---|---|
| Tensile SiN | 2.63 | 2.41 |
| Compressive SiN | 3.17 | 2.57 |

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of increasing the stress level of an as deposited stressor material comprising:
forming an amorphous film stressor material on at least a surface of a substrate, said amorphous film stressor material having a tensile mechanical strain defining a stress value, and is selected from a hydrogen-containing nitride, a hydrogen-containing oxide, or a hydrogen-containing metal; and
densifying the amorphous film stressor material such that the state of mechanical strain is not substantially altered, while increasing the stress value, said densifying forms an upper region having a thickness from about 0.5 to about 50 nm and a lower region in said amorphous film stressor material, said upper region having a higher density as compared to said lower region and said densifying comprises (i) radiation exposure, or (ii) plasma nitridation in the presence of a plasma including one of atomic nitrogen, molecular nitrogen, atomic nitrogen ions and combinations thereof.

2. The method of claim 1 wherein said steps of forming and densifying are repeated any number of times to provide a multilayered stressor material having a preselected thickness.

3. The method of claim 1 wherein said amorphous film stressor material comprises SiN or SiN containing hydrogen.

4. The method of claim 1 wherein forming said amorphous film stressor material comprises a deposition process that is performed at a temperature of about 550° C. or less.

5. The method of claim 1 wherein said densifying comprises plasma nitridation that is performed at a temperature of about 550° C. or less.

6. The method of claim 1 further comprising shaping the densified amorphous stressor film material.

7. The method of claim 4 wherein said deposition process comprises chemical vapor deposition, plasma-enhanced chemical vapor deposition, or rapid thermal chemical vapor deposition.

8. The method of claim 7 wherein forming said deposition process is plasma-enhanced chemical vapor deposition.

9. The method of claim 5 wherein said plasma nitridation is performed for a time period from about 0.5 to about 200 seconds.

10. A method of increasing the stress level of an as deposited stressor material comprising:
forming an amorphous film stressor material on at least a surface of a substrate, said amorphous film stressor material having a compressive mechanical strain defining a stress value, and is selected from a hydrogen-containing nitride, a hydrogen-containing oxide, or a hydrogen-containing metal; and
densifying the amorphous film stressor material such that the state of mechanical strain is not substantially altered, while increasing the stress value, said densifying forms an upper region having a thickness from about 0.5 to about 50 nm and a lower region in said amorphous film stressor material, said upper region having a higher density as compared to said lower region and said densifying comprises (i) radiation exposure, or (ii) plasma nitridation in the presence of a plasma including one of atomic nitrogen, molecular nitrogen, atomic nitrogen ions and combinations thereof.

11. A method of increasing the stress level of an as deposited stressor material comprising:
forming an amorphous film stressor material by plasma-enhanced chemical vapor deposition on at least a surface of a substrate, said amorphous film stressor material having a state of mechanical strain defining a stress value; and
densifying the amorphous film stressor material by plasma nitridation at a temperature of about 500° C. or less such that the state of mechanical strain is not substantially altered, while increasing the stress value.

12. The method of claim 11 wherein said steps of forming and densifying are repeated any number of times to provide a multilayered stressor material having a preselected thickness.

13. The method of claim 11 wherein said amorphous film stressor material comprises a nitride, an oxide, or a metal.

14. The method of claim 11 wherein said amorphous film stressor material comprises SiN or SiN containing hydrogen.

15. The method of claim 11 wherein said state of mechanical strain is tensile.

16. The method of claim 11 wherein said state of mechanical strain is compressive.

17. The method of claim 11 wherein said plasma nitridation is performed in the presence of a nitrogen-containing plasma comprises one of atomic nitrogen, molecular nitrogen and atomic nitrogen ions.

18. The method of claim 11 wherein said plasma nitridation is performed for a time period from about 0.5 to about 200 seconds.

19. The method of claim 11 wherein said densifying forms an upper region and a lower region of said amorphous film stressor material, said upper region having a higher density as compared to said lower region.

20. The method of claim 19 wherein said upper region has a thickness from about 0.5 to about 50 nm.

21. The method of claim 11 further comprising shaping the densified amorphous stressor film material.

22. The method of claim 13 wherein said amorphous film stressor material further includes hydrogen.

23. A method of increasing the stress level of an as deposited stressor material comprising:
forming an amorphous film stressor material utilizing plasma enhanced chemical vapor deposition that is performed at a temperature of 500° C. or less on at least a surface of a substrate, said amorphous film stressor material having a state of mechanical strain defining a stress value, and is selected from a hydrogen-containing nitride, a hydrogen-containing oxide, or a hydrogen-containing metal; and
densifying the amorphous film stressor material such that the state of mechanical strain is not substantially altered, while increasing the stress value, said densifying forms an upper region having a thickness from about 0.5 to about 50 nm and a lower region in said amorphous film stressor material, said upper region having a higher density as compared to said lower region and said densifying comprises (i) radiation exposure, or (ii) plasma nitridation in the presence of a plasma including one of atomic nitrogen, molecular nitrogen, atomic nitrogen ions and combinations thereof.

* * * * *